(12) United States Patent
Nomoto et al.

(10) Patent No.: US 7,985,694 B2
(45) Date of Patent: Jul. 26, 2011

(54) METHOD FOR FORMING PATTERN, METHOD FOR MANUFACTURING SEMICONDUCTOR DEVICE AND SEMICONDUCTOR DEVICE

(75) Inventors: Akhiro Nomoto, Kanagawa (JP); Kazumasa Nomoto, Kanagawa (JP); Toshio Fukuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 238 days.

(21) Appl. No.: 12/101,532

(22) Filed: Apr. 11, 2008

(65) Prior Publication Data

US 2008/0251844 A1    Oct. 16, 2008

(30) Foreign Application Priority Data

Apr. 16, 2007   (JP) ................. 2007-106864

(51) Int. Cl.
   *H01L 21/31*   (2006.01)
(52) U.S. Cl. .. 438/759; 438/149; 438/158; 257/E21.411
(58) Field of Classification Search ............. 438/149, 438/158, 161, 759; 257/E21.411; 101/492; 216/54; 427/271
See application file for complete search history.

(56) References Cited

U.S. PATENT DOCUMENTS

| | | | | |
|---|---|---|---|---|
| 6,966,997 B1 * | 11/2005 | Inganas et al. | | 216/36 |
| 7,306,969 B2 * | 12/2007 | Wu et al. | | 438/99 |
| 2009/0283000 A1 * | 11/2009 | Nomoto | | 101/395 |
| 2010/0029040 A1 * | 2/2010 | Nomoto | | 438/99 |
| 2010/0044905 A1 * | 2/2010 | Fukuda et al. | | 264/104 |

FOREIGN PATENT DOCUMENTS

| | | |
|---|---|---|
| JP | 11-058921 | 3/1999 |
| JP | 2004-128469 | 4/2004 |
| JP | 2006-173277 | 6/2006 |
| JP | 2006-278845 | * 10/2006 |

OTHER PUBLICATIONS

Japanese Patent Office Action corresponding to Japanese Serial No. JP2007-106864 dated Sep. 15, 2009.

* cited by examiner

*Primary Examiner* — Steven Loke
*Assistant Examiner* — Daniel Whalen
(74) *Attorney, Agent, or Firm* — SNR Denton US LLP (57) ABSTRACT

A method for forming a pattern includes the step of forming an electrically conductive film by applying a liquid composition onto a first plate. The liquid composition includes an organic solvent and conductive particles surface-modified with a fatty acid or an aliphatic amine. Then, a second pattern, which is a reverse pattern of a first pattern, is formed on the first plate by pressing a second plate having a concave-convex pattern on a surface thereof on a surface of the first plate having the electrically conductive film on the surface thereof. Then, the first pattern of the electrically conductive film is transferred onto convex top faces of the second plate. Then, the second pattern is transferred onto a surface of a transfer substrate by pressing the surface of the first plate having the second pattern thereon on the surface of the transfer substrate.

8 Claims, 5 Drawing Sheets

METHOD FOR FORMING PATTERN, METHOD FOR MANUFACTURING SEMICONDUCTOR DEVICE AND SEMICONDUCTOR DEVICE

CROSS REFERENCES TO RELATED APPLICATIONS

The present invention contains subject matter related to Japanese Patent Application JP 2007-106864 filed in the Japanese Patent Office on Apr. 16, 2007, the entire contents of which are incorporated herein by reference.

BACKGROUND OF THE INVENTION

1. Field of the Invention

The present invention relates to a method for forming a pattern, a method for manufacturing a semiconductor device, and a semiconductor device, and, in particular, relates to a method for forming an electrically conductive pattern, a method for manufacturing a thin film transistor using the method for forming the electrically conductive pattern, and a thin film transistor.

2. Description of the Related Art

In the field of manufacturing semiconductor devices and image displays such as liquid crystal displays, many kinds of electrically conductive materials are used to form circuits. Since the density and definition have been further increased in recent years in the field of such applications, high resolution and high reliability are desired in a method for forming wiring patterns and an electric conductive material.

In the field of manufacturing electrode substrates to be mounted on electric/electronic components, when a high resolution for forming a circuit pattern on a predetermined substrate is desired, photolithography has been frequently used.

Usually, a circuit pattern is formed by photolithography including depositing an electrically conductive film on a substrate by sputtering or the like, forming a resist film (photosensitive resin) on the electrically conductive film, exposing and developing the resist film to form a resist pattern, and then removing unnecessary exposed portions of the electrically conductive film to form the resist pattern by etching using the resist pattern as a mask. Then, the desired circuit pattern is completed by removing the resist pattern. By using photolithography as mentioned above, very fine circuit patterns can be formed with high resolution.

However, photolithography including steps of exposing, developing, and drying has many steps and is complicated, and it also may need high-precision equipment and environmental control, and a system comes to be large.

Furthermore, when an electrically conductive film is deposited by sputtering, since a high temperature process is desired as a film forming condition, thermal expansion or degradation of the substrate will occur due to thermal stress arising in the substrate. Therefore, when a circuit pattern is formed on a substrate by photolithography, the selection of substrates that can be used is highly limited. Furthermore, in the above-mentioned etching, if a wet etching is used, since the substrate is immersed in an etching solution, the substrate and portions such as a layer under a metal layer having been formed in preceding processes may be damaged.

In consideration of the above, as a method for forming a fine pattern without using photolithography, Japanese Unexamined Patent Application Publication No. 11-58921 discloses a printing method in which a fine pattern is formed by applying ink (resin) onto the entirety of a surface of a first plate, which is called a blanket covered with a silicone rubber, so as to form a thin film, pressing a second plate having a concave-convex pattern on a surface thereof on a surface of the first plate having the thin film formed thereon so as to transfer an unnecessary pattern of the thin film onto top faces of convex portions of the second plate resulting in removal an unnecessary pattern, and transferring the resulting thin film (resin pattern) remaining on the surface of the first plate onto a transfer substrate.

Japanese Unexamined Patent Application Publication No. 2006-278845 discloses another method for forming an electrically conductive pattern, in which an electrically conductive ink composition including metal particles, an aqueous solvent, and a water-soluble resin is used in the printing method described in the Japanese Unexamined Patent Application Publication No. 11-58921.

Note that when the above-mentioned printing method is applied to formation of a circuit pattern of a semiconductor device, the circuit pattern is desired to be 500 nm or less in thickness because a thin circuit pattern is suitable for a thin electronic apparatus. Therefore, it is desired to reduce the thickness of the electrically conductive film applied onto the first plate.

SUMMARY OF THE INVENTION

When the printing method described in Japanese Unexamined Patent Application Publication No. 11-58921 is used to form a circuit pattern, it is difficult to control viscosity of a resin to be within a range of 50 cps to 500 cps, which is suitable for offset printing. This is because metal particles are dispersed in the resin leading to an increase in the viscosity of the resin. Thus, formation of an electrically conductive thin film is difficult when this method is used. Furthermore, it is difficult to uniformly apply the resin over the entire surface of a first plate because silicone rubber on the surface of the first plate generally repels liquids. Furthermore, if the resin is not of a fast drying type, efficiency of transferring a pattern onto a transfer substrate is undesirably lowered.

When the printing method described in Japanese Unexamined Patent Application Publication No. 2006-278845 is used, as mentioned above, it is difficult to form an electrically conductive film having a uniform thickness, because an electrically conductive ink composition including an aqueous solvent is repelled when applied onto the surface of the first plate composed of the silicone rubber having repellency. Thus, it is difficult to stably form a fine electrically conductive pattern with high accuracy.

In order to solve the above-mentioned problems, it is desirable to provide a method for forming a pattern and a method for manufacturing a semiconductor device, which can be used to form an electrically conductive thin film having a uniform thickness on a first plate, and to provide a semiconductor device.

To provide such methods and a device, a method for forming a circuit pattern according to an embodiment of the present invention includes the following processes which are sequentially performed. In a first process, an electrically conductive film is formed by applying a liquid composition onto a first plate, the liquid composition containing an organic solvent and conductive particles surface-modified with a fatty acid or an aliphatic amine. In a second process, a second pattern being a reverse pattern, which is the reverse of a first pattern, is formed on the first plate by pressing a second plate having a concave-convex pattern on a surface thereof on a surface of the first plate having the electrically conductive film formed thereon and transferring the first pattern of the electrically conductive film onto convex top faces of the second plate. In a third process, the second pattern is transferred onto a surface of a transfer substrate by pressing a surface of the first plate having the second pattern formed thereon on the surface of the transfer substrate.

According to the method for forming a circuit pattern, the surface-modified conductive particles come to have high dispersibility in the organic solvent because the liquid composition includes the organic solvent and the conductive particles surface-modified with a fatty acid or an aliphatic amine. If the above-mentioned method for forming the circuit pattern using the liquid composition is applied, viscosity of the liquid composition may be lowered without addition of a binder for keeping dispersion stability of the conductive particles. Thus, an electrically conductive thin film having a uniform thickness can be formed on the first plate. Therefore, a fine electrically conductive thin pattern can be stably formed on the surface of the transfer substrate with high accuracy.

A method for manufacturing a semiconductor device and a semiconductor device manufactured thereby according to an embodiment of the present invention are characterized in that the above-mentioned method for forming a circuit pattern is applied to a method for forming source-and-drain electrodes or gate electrodes of semiconductor devices. According to the method for manufacturing the semiconductor device and according to the semiconductor device, the source-and-drain electrodes or the gate electrodes, which are fine and thin, can be stably formed with high accuracy by forming an electrically conductive thin film having a uniform thickness on the first plate.

As described above, according to the method for forming a circuit pattern, the method for manufacturing a semiconductor device using the method for forming the circuit pattern, and the semiconductor device, a fine electrode pattern of the semiconductor device can be formed by printing, which results in simplification of the manufacturing process of the semiconductor device. This is because a fine and thin electrically conductive pattern can be stably formed with high accuracy.

DESCRIPTION OF THE PREFERRED EMBODIMENTS

A preferred embodiment of the present invention is described below in detail with reference to the drawings.

A method for forming a pattern according to an embodiment of the present invention is described by taking, as an example, a method for manufacturing a semiconductor device composed of a bottom-gate-and-bottom-contact type thin film transistor with reference to cross-sectional views of FIGS. 1A to 1D showing steps of manufacturing the semiconductor device. In the present embodiment, source-and-drain electrodes of the above-mentioned thin film transistor are formed using a method of forming a pattern of the present invention.

Figure 1A:
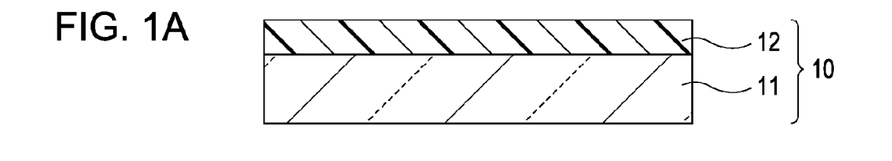
FIGS. 1A to 1D are cross-sectional views (1) showing respective steps of a method for manufacturing a semiconductor device according to an embodiment of the present invention.

As shown in FIG. 1A, a first plate 10, i.e., a blanket, is a plate having a glass substrate 11 and, for example, a polydimethylsilane (PDMS) layer 12 disposed on the glass substrate 11. The first plate 10 is manufactured by applying PDMS onto the glass substrate 11 using spin coating or the like, and then hardening the applied PDMS by heating. The resulting PDMS layer 12 has a flat surface.

Figure 1B:
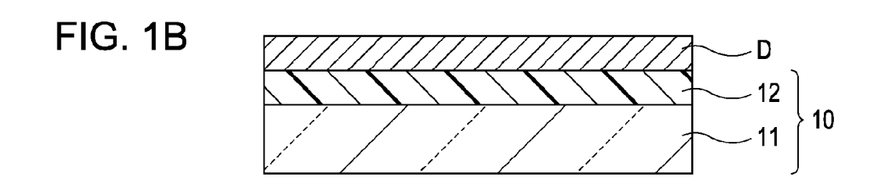

As shown in FIG. 1B, as a characteristic structure of the present invention, an electrically conductive film D is disposed by cap-coating or the like on the first plate 10 with a liquid composition, which includes an organic solvent and conductive particles surface-modified with a fatty acid or an aliphatic amine. Here, the liquid composition including the conductive particles, which are surface-modified with a fatty acid or an aliphatic amine, has significantly high dispersibility in the organic solvent. Even if the liquid composition has been left for one to several weeks at room temperature, precipitation of the conductive particles involved in the liquid composition is not found. Therefore, the liquid composition is considered to have sufficient preservation stability, which is desired for material storage in mass-production. Furthermore, since the liquid composition is highly dispersible in organic solvents, viscosity of the liquid composition can be lowered. This is because a binder composed of resin components, which has been previously used in order to maintain dispersion stability of the liquid composition, need not be added.

Here, as described in Description of the Related Art, when a circuit pattern (wiring pattern) of a semiconductor device such as a thin film transistor is formed, the thickness of the circuit pattern is desired to be 500 nm or less. Therefore, the thickness of the electrically conductive film D formed on the first plate 10 may be 500 nm or less in a dried state. When the electrically conductive film D is wet, the thickness thereof is specified by the concentration of the electrically conductive particles therein. For example, if the concentration of the electrically conductive particles is 10 wt %, the electrically conductive film D may be formed to have a uniform thickness of 5 µm or less. In such a case, the viscosity of the liquid composition is preferably 30 mPas or lower, and the lowest level of the viscosity is about 0.8 mPas. The lowest level thereof is specified by the viscosity value of solvent used.

Here, examples of the electrically conductive particles include gold, silver, copper, platinum, palladium, and nickel particles, and mixtures of those particles. In particular, if silver nanoparticles are used as the electrically conductive particles, the firing temperature can be preferably decreased to a lower level than that necessary when using other metal particles. Either a dry process or a wet process can be performed to form the electrically conductive particles. Particles having a diameter of 50 nm or less can be preferably used and, more preferably, particles having a diameter of about 1 nm to 20 nm can be used.

As the fatty acid or the aliphatic amine used for modifying the surfaces of the electrically conductive particles, compounds having 11 to 21 carbon atoms are suitably used regardless of whether they are saturated aliphatic or unsaturated aliphatic. This is because the above-mentioned compounds have high dispersion stability and develop electrical conductivity when sintered at a temperature of 250° C. or lower, and materials thereof are easily available. Examples of the fatty acid include lauric acid, myristic acid, palmitic acid, oleic acid, and stearic acid. Examples of the aliphatic amine include amine derivatives such as primary amines, secondary amines, tertiary amines, diamines, and amide compounds, each having 11 to 21 carbon atoms. Specific examples of the above-mentioned aliphatic amine include oleylamine and stearic acid amide.

For the method used to surface-modify the conductive particles with the fatty acid or the aliphatic amine, a widely known method can be properly used. Here, an example of a method using silver particles is described. The fatty acid or aliphatic amine is made to adhere to the surfaces of the silver particles by mixing the silver nanoparticles in an organic solvent such as tetrahydroxyfuran (THF), adding a reducing agent such as a hydrazine compound to the organic solvent, adding a proper amount of the desired fatty acid or aliphatic amine, and heating the resulting mixture.

Here, the surface-modified conductive particles are contained in the liquid composition at a ratio of 0.1 wt % to 80 wt %, preferably 5 wt % to 20 wt %.

Among the above-mentioned liquid compositions, when the liquid composition containing silver nanoparticles surface-modified with oleic acid is used, the electrically conductive film D having a uniform thickness of 500 nm or less can be preferably formed on a first plate 10. Furthermore, transfer of an unnecessary portion of the electrically conductive film D onto a second plate, which is performed in a subsequent step, can be securely achieved with high accuracy.

The solvent in which the surface-modified conductive particles are dispersed may be properly used alone or used as a mixed solvent of more than one solvent, if desired. Among organic solvents, in particular, non-polar solvents are preferably used because dispersion stability of the conductive particles in the liquid composition can be maintained. Examples of the non-polar solvents include hydrocarbon solvents such as pentane, hexane, heptane, octane, decane, dodecane, isopentane, isohexane, isooctane, cyclohexane, methylcyclohexane, and cyclopentane. Also aromatic solvents such as toluene, xylene, and mesitylene can be preferably used. If an organic solvent is used alone, an organic solvent having a boiling point of 50° C. or more and 150° C. or less is preferably used. Examples of such organic solvents include cyclohexane having a boiling point of 80.7° C., heptane having a boiling point of 98° C., and toluene having a boiling point of 110.6° C.

Besides the non-polar solvents, ester solvents, alcohol solvents, ketone solvents, and the like can be used as the organic solvent according to printability. For example, methyl acetate, ethyl acetate, or ethyl propionate can be used as an ester solvent, ethanol, propanol, or isopropanol can be used as an alcohol solvent, and acetone, methyl ethyl ketone, or methyl isobutyl ketone can be used as a ketone solvent. These solvents can suitably function for printability.

Examples of a method for coating the above-mentioned liquid composition onto the first plate 10 include the cap-coating mentioned above, roll-coating, spray-coating, dip-coating, curtain-flow-coating, wire-bar-coating, gravure-coating, air-knife-coating, doctor-blade-coating, screen-coating, and die-coating. The coating method is desirable to be selected in accordance with the shape of the first plate 10 such as a roll shape or a plate shape. Among the coating methods mentioned above, in particular, cap-coating is preferable because of its excellent coating properties.

Figure 1C:
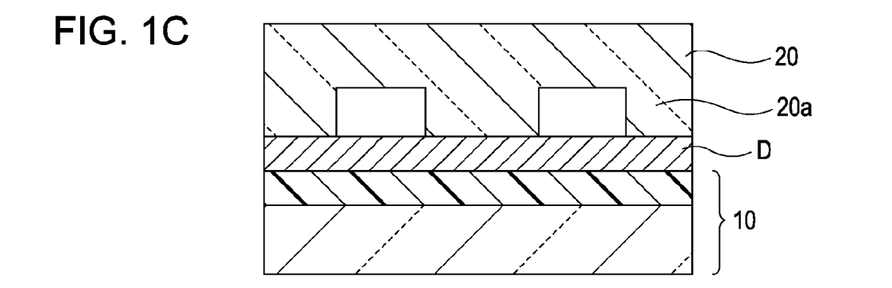

Next, as shown in FIG. 1C, a second plate 20, which is a glass plate, etc., having a concave-convex pattern on a surface thereof is pressed on a surface of the first plate 10 having the electrically conductive film D formed thereon. A convex pattern of the concave-convex pattern is formed to correspond to a reverse pattern of an electrically conductive pattern, as described later. Fine concave-convex pattern can be formed with high precision when the concave-convex pattern of the second plate 20 is formed by etching using an existing photolithography technique.

Figure 1D:
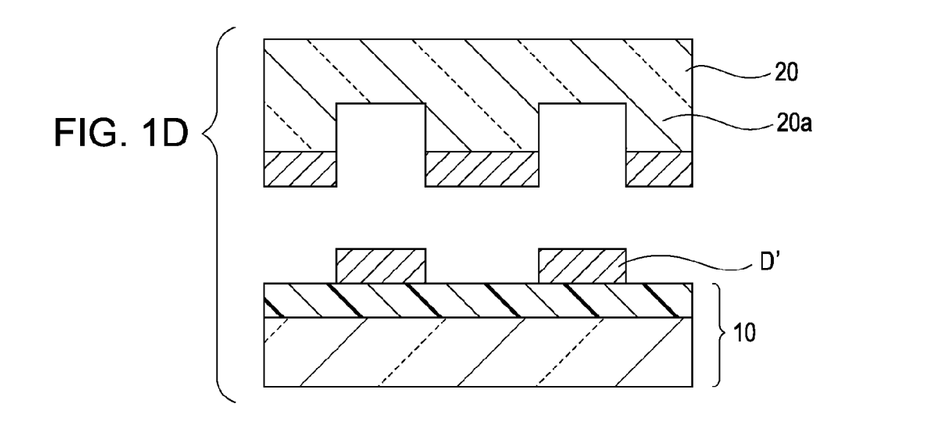

Here, a material of the surface of the second plate 20 has lower surface tension than that of the first plate 10 so that the top faces of convex portions 20a of the second plate 20 have higher adhesiveness to the electrically conductive film D than the surface of the first plate 10. Thus, as shown in FIG. 1D, an electrically conductive pattern D' (second pattern) is formed on the first plate 10 by pressing the second plate 20 on the surface of the first plate 10 having the electrically conductive film D formed thereon resulting in transfer of an unnecessary pattern (first pattern) of the electrically conductive film D (shown in FIG. 1C) to the top faces of the convex portions 20a. This electrically conductive pattern D' is the reverse pattern of the pattern transferred to the top faces of the convex portions 20a. Note that, the pattern of the electrically conductive film D transferred to the top faces of the convex portions 20a may be collected and reused.

Figure 2E:
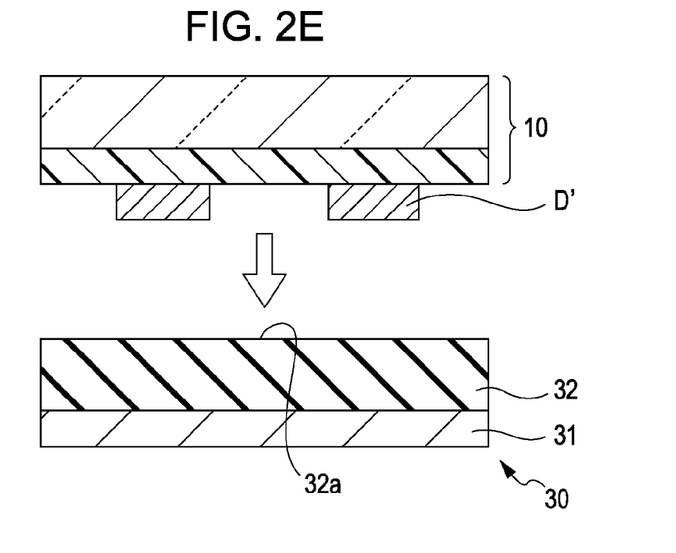
FIGS. 2E to 2G are cross-sectional views (2) showing respective steps of a method for manufacturing a semiconductor device according to an embodiment of the present invention.

Next, as shown in FIG. 2E, the surface of the first plate 10 having the electrically conductive pattern D' formed thereon is pressed on a transfer surface of a transfer substrate 30. Here, the transfer substrate 30 is composed of a substrate 31 including a silicon substrate and an insulating film 32 made of polyvinylphenol (PVP) formed on the substrate 31. Therefore, a surface 32a of the insulating film 32 serves as the transfer surface. Here, the substrate 31 made of a silicon substrate serves also as a gate electrode by being heavily doped with impurity ions. The insulating film 32 disposed thereon serves as a gate insulating film.

Figure 2F:
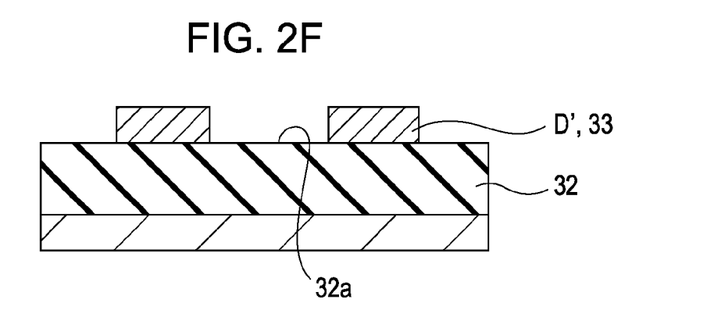

Here, the insulating film 32 is composed of a material having a lower surface tension than that of the second plate 20 so that the surface 32a, which is the transfer surface, of the insulating film 32 has higher adhesiveness to the electrically conductive pattern D' than the top faces of the convex portions 20a of the second plate 20. Thus, by pressing the surface of the first plate 10 having the electrically conductive pattern D' formed thereon on the transfer surface of the transfer substrate 30, the electrically conductive pattern D' is transferred onto the surface 32a of the insulating film 32 as shown in FIG. 2F. This electrically conductive pattern D' serves as source-and-drain electrodes 33.

Therefore, if this printing method is used to form the source-and-drain electrodes 33, roughness of the surface of the insulating film 32 caused by etching or remainders of a resist pattern is prevented as compared with the case where photolithography is used to form the source-and-drain electrodes 33 by patterning an electrically conductive film disposed on the insulating film 32. This may improve the properties of an interface between the insulating film 32 and a semiconductor layer 34 resulting in an enhancement of transistor characteristics.

Then, the above-mentioned electrically conductive pattern D' is sintered by heating in an oven for example. Here, the thickness of the sintered electrically conductive pattern D' is 500 nm or less. It is found that contact resistance of the sintered electrically conductive pattern D' is low compared with that of the sintered pattern D' that is formed with a liquid composition including a binder such as a resin composition. The sintered pattern D' includes oleic acid that was bound to the silver nanoparticles, and it is found that the oleic acid, which remains in the sintered pattern D', also lowers the contact resistance.

Figure 2G:
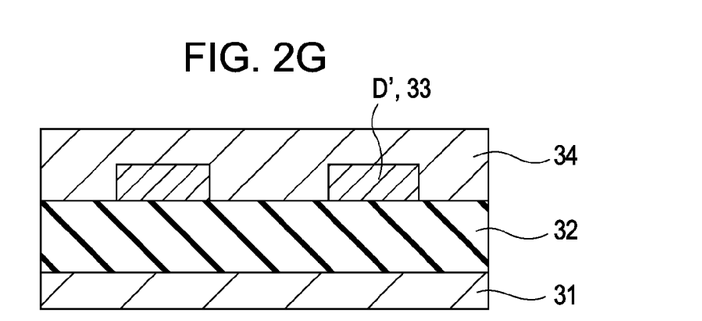

After this step of the manufacturing process, the process is performed in a similar manner according to existing processes of manufacturing thin film transistors. That is, as shown in FIG. 2G, the semiconductor layer 34 composed of, for example, triisopropylsilylethynyl pentacene is formed by spin-coating, etc., on the insulating film 32 so that the semiconductor layer 34 covers the source-and-drain electrodes 33 composed of the electrically conductive pattern D'.

According to the above-mentioned process, a bottom-gate-and-bottom-transistor type thin film transistor in which the insulating film (gate insulating film) 32, the source-and-drain electrodes 33, and the semiconductor layer 34 are laminated in that order on the substrate (gate electrode) 31 is manufactured.

According to the above-mentioned method for forming a pattern, the method for manufacturing a semiconductor device using the method for forming a pattern, and the semiconductor device manufactured thereby, the electrically conductive thin film D having a uniform thin thickness is formed on the first plate 10 using the liquid composition including the organic solvent and the conductive particles surface-modified with the fatty acid or aliphatic amine. Thus the fine electrically conductive thin pattern D' may be stably formed on the surface of the transfer substrate with high accuracy. Therefore, by printing, fine source-and-drain electrodes of a semiconductor device may be formed and a process of manufacturing the semiconductor device may be simplified.

Figure 3:
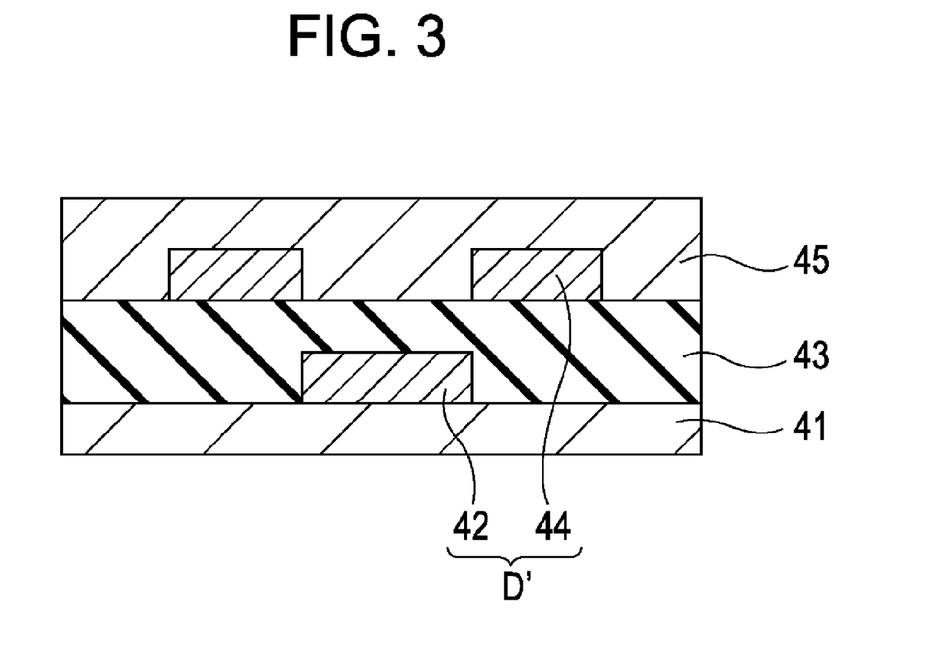
FIG. 3 is a cross-sectional view (3) showing respective steps of a method for manufacturing a semiconductor device according to an embodiment of the present invention.

Note that, in the above-mentioned embodiment, although an example of formation of the source-and-drain electrodes is described, the method used in the embodiment can be applied to formation of gate electrodes or the like on an insulating substrate. In such a case, as shown in FIG. 3, a plastic substrate 41, which is composed of polyethersulfone or the like, is used as the transfer substrate 30, and a gate electrode 42 is formed by transferring the electrically conductive pattern D' onto the plastic substrate 41 based on a similar method used in the embodiment. Then, a gate insulating film 43, source-and-drain electrodes 44, and a semiconductor layer 45 are formed in a similar manner as the insulating film 32, the source-and-drain electrodes 33, and the semiconductor layer 34, respectively, which are described in the embodiment with reference to FIGS. 2E to 2G.

Furthermore, the method used in the embodiment can be applied to formation of electrode patterns constituting other types of transistors as well as formation of the above-mentioned bottom-gate-and-bottom-contact type transistors. Furthermore, the method used in the embodiment can be applied to formation of electrode patterns constituting other electronic components such as printed wiring boards, RF-ID tags, and various boards for display devices as well as thin film transistors.

Here, specific examples of the present invention are described with reference again to FIGS. 1A to 2G.

EXAMPLE 1

Similar to the above-mentioned embodiment, a first plate 10 (blanket) was formed on a glass substrate 11 by applying PDMS (Dow Corning Corporation, Silpot) using a spin coater and curing the PDMS by heating. Then, a liquid composition containing cyclohexane and silver nanoparticles dispersed in the cyclohexane to be 5 wt % was prepared, the surfaces of the silver nanoparticles (an average diameter of 10 nm) being treated with oleic acid. Next, an electrically conductive film D was formed on the first plate 10 by applying the liquid composition thereonto using a spin coater.

On the other hand, a second plate 20 composed of a glass plate was formed by applying a photoresist (KAYAKU MICROCHEM CO., LTD., SU-8) onto a glass substrate to form a photoresist film having a thickness of 5 μm using a spin-coater, and exposing and developing the photoresist film resulting in formation of a concave-convex pattern having a line-and-space (L/S) of 5 μm (aspect ratio 1:1) on a surface of the glass substrate.

Then, an electrically conductive pattern D' (second pattern) was formed on the first plate 10 by pressing the second plate 20 on a surface of the first plate 10 having the electrically conductive film D formed thereon to transfer an unnecessary pattern (first pattern) of the electrically conductive film D onto convex portions 20a of the second plate 20.

Here, a transfer substrate 30 having an insulating film 32 made of polyvinyl pyrrolidone (PVP) was prepared by applying a solution onto a substrate 31 using a spin-coater. The solution contained a PVP resin solution (solvent, propylene glycol monomethyl ether acetate (PGMEA); concentration, 20 wt %) and a cross-linking agent made of a melamine formaldehyde resin. Next, the electrically conductive pattern D' was transferred onto a surface of the insulating film 32 by pressing the surface of the first plate 10 having the electrically conductive pattern D' thereon on a transfer surface 32a of the transfer substrate 30. Then, a wiring pattern having electrical conductivity was formed by fixing the electrically conductive pattern D' so as to sinter the silver nanoparticles in an oven for one hour at a temperature of 180° C.

Figure 4A:
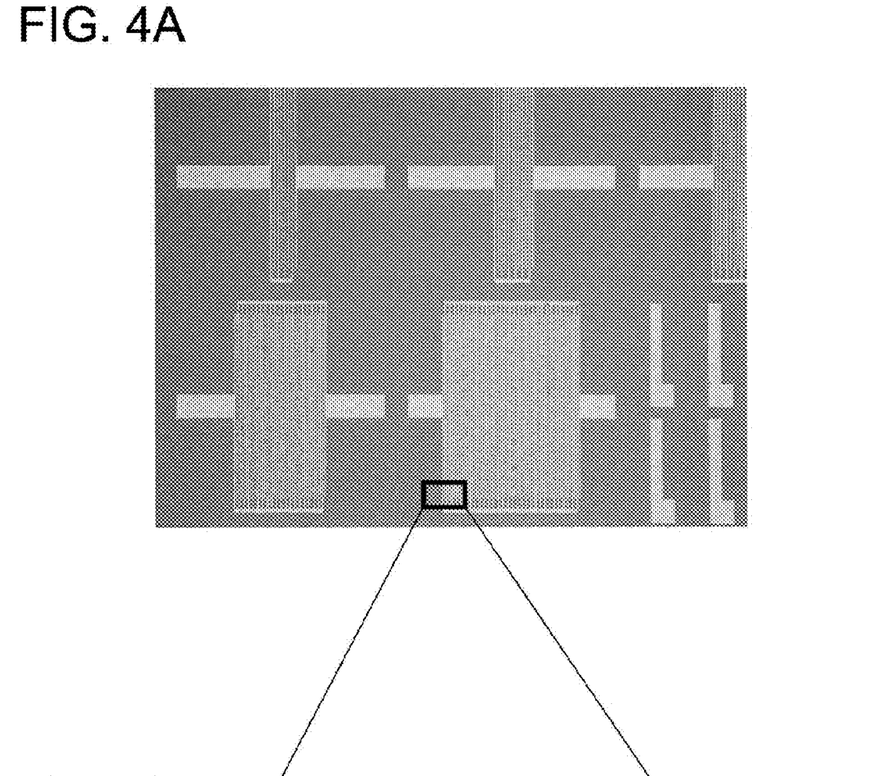
FIGS. 4A and 4B are optical microscopic images of wiring patterns formed according to EXAMPLE 1.
Figure 4B:
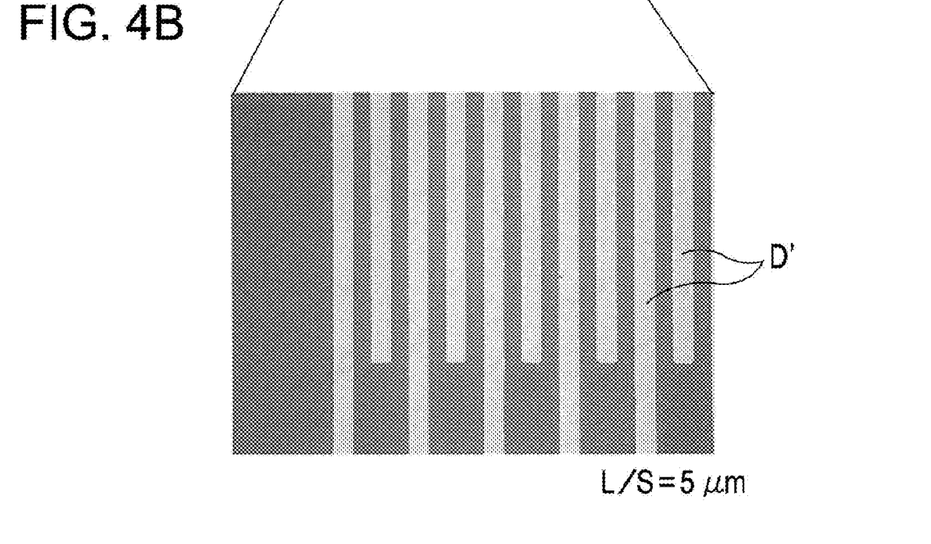

As a result, it was found that the electrically conductive pattern D' having a line-and-space of 5 μm is formed without any problems as shown in FIG. 4B, which is an enlarged image of a region X in FIG. 4A.

COMPARATIVE EXAMPLE 1

Figure 5A:
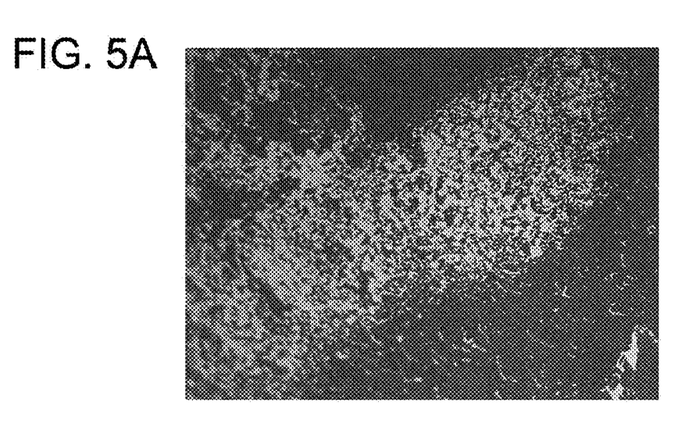
FIGS. 5A to 5C are optical microscopic images of wiring patterns formed according to COMPARATIVE EXAMPLES 1 to 3.

On the other hand, as COMPARATIVE EXAMPLE 1 corresponding to EXAMPLE 1, an electrically conductive pattern D' was formed on a first plate 10, and then, the pattern D' was transferred onto a transfer substrate 30. The liquid composition (Sumitomo Electric Industries, Ltd., AGIN-W) applied onto the first plate 10, which was similar to that used in EXAMPLE 1, included silver nanoparticles with high dispersibility which were dispersed in a water-soluble organic solvent and a water solvent. As a result, as shown in FIG. 5A, the electrically conductive pattern D' formed by transferring onto a surface of the insulating film 32 was not transferred onto the transfer substrate 30. This was because the electrically conductive film D disposed on a surface of the first plate 10 had high adhesiveness therebetween.

COMPARATIVE EXAMPLE 2

Figure 5B:
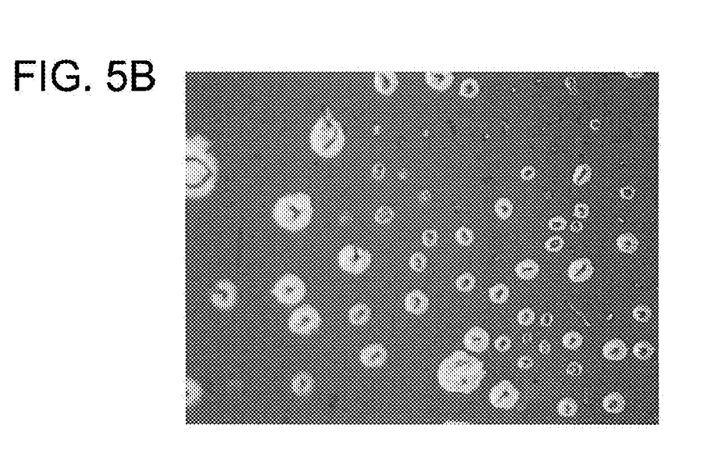

As COMPARATIVE EXAMPLE 2 corresponding to EXAMPLE 1, a liquid composition (SUMITOMO METAL MINING CO., LTD., DCG-310-CN10) containing silver nanoparticles that were dispersed in an alcohol solvent (polar solvent) was applied onto a first plate 10, which was similar to that used in EXAMPLE 1. As a result, as shown in FIG. 5B, the liquid composition aggregated on a surface of the first plate 10 failing to form the electrically conductive film D on the first plate 10.

COMPARATIVE EXAMPLE 3

Figure 5C:
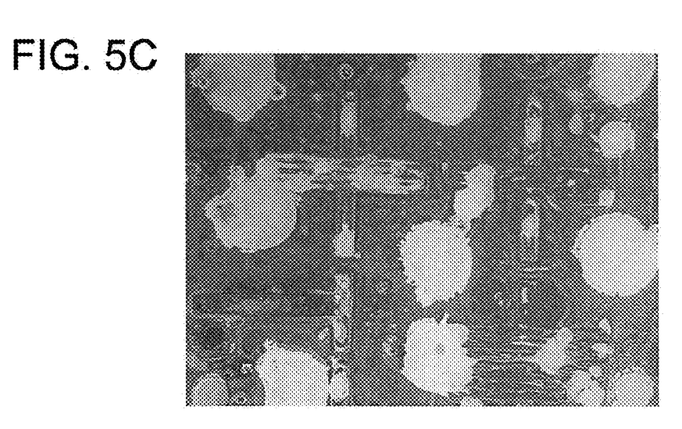

Furthermore, as COMPARATIVE EXAMPLE 3 corresponding to EXAMPLE 1, an electrode pattern was formed according to a similar method as used in EXAMPLE 1. In this example, a liquid composition (Cabot Corporation, AG-IJ-G-100-S1) included silver-based particles surface-coated with a polymer material and dispersed in a glycol-type solvent (polar solvent). As a result, as shown in FIG. 5C, the electrically conductive pattern D' transferred onto a surface of an insulating film 32 was broken and a desired electrode pattern was not formed.

It should be understood by those skilled in the art that various modifications, combinations, sub-combinations and alterations may occur depending on design requirements and other factors insofar as they are within the scope of the appended claims or the equivalents thereof.

What is claimed is:

1. A method for forming a pattern comprising the steps of:
    forming an electrically conductive film by applying a liquid composition onto a first plate, the liquid composition including an organic solvent and conductive particles surface-modified with a fatty acid or an aliphatic amine;
    forming a second pattern being a reverse pattern of a first pattern on the first plate by pressing a second plate having a concave-convex pattern on a surface thereof on a surface of the first plate having the electrically conductive film formed thereon and transferring the first pattern of the electrically conductive film onto convex top faces of the second plate; and
    transferring the second pattern onto a surface of a layer on a transfer substrate by pressing the surface of the first plate having the second pattern onto the layer on the surface of the transfer substrate,
    wherein,
        the layer on the transfer substrate comprises a material having higher adhesiveness to the electrically conductive film than that of the second plate.

2. The method for forming a pattern according to claim 1, wherein the conductive particles are silver nanoparticles.

3. The method for forming a pattern according to claim 1, wherein the conductive particles are surface-modified with oleic acid.

4. The method for forming a pattern according to claim 1, wherein the organic solvent is a non-polar solvent.

5. The method for forming a pattern according to claim 4, wherein the organic solvent includes a hydrocarbon solvent.

6. The method for forming a pattern according to claim 5, wherein the hydrocarbon solvent includes one of heptane and octane.

7. The method for forming a pattern according to claim 5, wherein a boiling point of the hydrocarbon solvent is 98° C. or more and 150° C. or less.

8. A method for manufacturing a semiconductor device having a source-and-drain electrode, a gate insulating film, and a gate electrode laminated on a substrate in that order or the reverse order and having a semiconductor layer at the upper side or lower side of the source-and-drain electrode, the method comprising the step of forming the source-and-drain electrode or the gate electrode, the step including the steps of:
    forming an electrically conductive film by applying a liquid composition onto a first plate, the liquid composition including an organic solvent and conductive particles surface-modified with a fatty acid or an aliphatic amine;
    forming a second pattern being a reverse pattern of a first pattern on the first plate by pressing a second plate having a concave-convex pattern on a surface thereof on a surface of the first plate having the electrically conductive film formed thereon and transferring the first pattern of the electrically conductive film onto convex top faces of the second plate; and
    transferring the second pattern onto a surface of a layer formed on the transfer substrate by pressing a surface of the first plate having the second pattern formed thereon on the surface of the layer to form the source-and-drain electrode or the gate electrode,
    wherein,
        the layer on the transfer substrate comprises a material having higher adhesiveness to the electrically conductive film than that of the second plate.

* * * * *

UNITED STATES PATENT AND TRADEMARK OFFICE
CERTIFICATE OF CORRECTION

PATENT NO. : 7,985,694 B2  
APPLICATION NO. : 12/101532  
DATED : July 26, 2011  
INVENTOR(S) : Akihiro Nomoto et al.

It is certified that error appears in the above-identified patent and that said Letters Patent is hereby corrected as shown below:

On the Title page of the patent:

(75) "Akhiro Nomoto, Kanagawa (JP)"

should be (75) --Akihiro Nomoto, Kanagawa (JP)--

Signed and Sealed this
Fourth Day of October, 2011

David J. Kappos
*Director of the United States Patent and Trademark Office*